US007030003B2

(12) United States Patent
Udagawa

(10) Patent No.: US 7,030,003 B2
(45) Date of Patent: Apr. 18, 2006

(54) COMPOUND SEMICONDUCTOR DEVICE, PRODUCTION METHOD THEREOF, LIGHT-EMITTING DEVICE AND TRANSISTOR

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 183 days.

(21) Appl. No.: 10/793,832

(22) Filed: Mar. 8, 2004

(65) Prior Publication Data

US 2004/0169180 A1 Sep. 2, 2004

Related U.S. Application Data

(62) Division of application No. 10/237,732, filed on Sep. 10, 2002, now Pat. No. 6,730,987.

(60) Provisional application No. 60/323,090, filed on Sep. 19, 2001.

(30) Foreign Application Priority Data

Sep. 10, 2001 (JP) .......................... P2001-272831

(51) Int. Cl.
*H01L 21/28* (2006.01)

(52) U.S. Cl. ....................... 438/604; 438/285; 438/602

(58) Field of Classification Search ................ 438/285, 438/590, 602–604
See application file for complete search history.

(56) References Cited

U.S. PATENT DOCUMENTS 3,788,890 A 1/1974 Mader et al.
3,877,060 A 4/1975 Shono et al.
4,293,370 A 10/1981 Nagano et al.
4,833,103 A 5/1989 Agostinelli et al.
4,865,659 A 9/1989 Shigeta et al.
4,872,046 A 10/1989 Morkoc et al.
4,963,508 A 10/1990 Umeno et al.
5,714,006 A 2/1998 Kizuki et al.
6,045,614 A 4/2000 de Lyon et al.
6,541,799 B1 * 4/2003 Udagawa ..................... 257/94
6,835,962 B1 * 12/2004 Udagawa ..................... 257/97
2003/0001162 A1 * 1/2003 Udagawa ..................... 257/79
2003/0234400 A1 * 12/2003 Udagawa ..................... 257/80
2004/0183089 A1 * 9/2004 Udagawa .................... 257/103

FOREIGN PATENT DOCUMENTS

JP 62-171114 7/1987
JP 8-139027 5/1996
JP 2002-185041 6/2002

OTHER PUBLICATIONS

Yoshio Honda et al., "Growth of (1τ101) GaN on a 7-degree off-oriented (001)Si substrate by selective MOVPE", Journal of Crystal Growth, (2002) vol. 242, pp. 82-86, no month cited.

* cited by examiner

*Primary Examiner*—Allan R. Wilson
(74) *Attorney, Agent, or Firm*—Sughrue Mion, PLLC

(57) ABSTRACT

A semiconductor device having a silicon single crystal substrate and a boron phosphide semiconductor layer containing boron and phosphorus as constituent elements on a surface of the silicon single crystal substrate is disclosed. The surface of the silicon single crystal substrate is a {111} crystal plane inclined at an angle of 5.0° to 9.0° toward a <110> crystal azimuth.

2 Claims, 3 Drawing Sheets

COMPOUND SEMICONDUCTOR DEVICE, PRODUCTION METHOD THEREOF, LIGHT-EMITTING DEVICE AND TRANSISTOR

CROSS-REFERENCE TO RELATED APPLICATIONS

This is a Divisional of application Ser. No. 10/237,732 filed Sep. 10, 2002, now U.S. Pat. No. 6,730,987, which claims benefit of Provisional Application No. 60/323,090 filed Sep. 19, 2001, the above-noted applications incorporated herein by reference.

BACKGROUND OF THE INVENTION

The present invention relates to a technique for fabricating a compound semiconductor device using a silicon (Si) single crystal substrate having a specific azimuth with respect to the plane of the substrate.

As one of Group III–V compound semiconductors, a boron phosphide (BP)-base Group III–V compound semiconductor (boron phosphide-base semiconductor) containing boron (B) and phosphorus (P) as constituent elements is known (see, Iwao Teramoto, *Handotai Device Gairon* (*Introduction of Semiconductor Device*), 1st ed., pp. 26–28, Baifukan (Mar. 30, 1995)). The boron phosphide (BP) has a small Philips ionicity of 0.006 (see, Philips, *Handotai Ketsugo Ron* (*Bonds and Bands in Semiconductors*), 3rd imp., page 51, Yoshioka Shoten (Jul. 25, 1985)) and is a substance almost comprising a covalent bond. Furthermore, this is a zinc-blende type cubic crystal and therefore, has a band structure of degenerate valence band (see, Toshiaki Ikoma and Hideaki Ikoma, *Kagobutsu Handotai no Kiso Bussei Nvumon* (*Guide for Basic Physical Properties of Compound Semiconductor*), 1st ed., pp. 14–17, Baifukan (Sep. 10, 1991)). By virtue of this, boron phosphide is advantageous in that a p-type electrically conducting layer can be readily formed.

Conventionally, various compound semiconductor devices are fabricated by using a boron phosphide layer provided on a silicon (Si) single crystal substrate. For example, a hetero-bipolar transistor (HBT) using a boron phosphide layer is known (see, *J. Electrochem. Soc.*, 125(4), pp. 633–637 (1978)). Also, a solar cell using a boron phosphide layer as the window layer is known (see, *J. Electrochem. Soc.*, supra). Furthermore, techniques for fabricating a blue-band or green-band light emission diode (LED) or laser diode (LD) using boron phosphide and a mixed crystal thereof are disclosed (see, Japanese Patents (1) 2809690, (2) 2809691 and (3) 2809692, and (4) U.S. Pat. No. 6,069,021).

The lattice constant of a monomer boron phosphide (BP, boron monosphosphide) is about 4.538 Å (see, *Handotai Device Gairon* (*Introduction of Semiconductor Device*), supra, page 28). On the other hand, the silicon (Si) single crystal used as the substrate is also a zinc-blende type cubic crystal and the lattice constant thereof is about 5.431 Å (see, *Handotai Device Gairon* (*Introduction of Semiconductor Device*), supra, page 28). Accordingly, the lattice mismatch degree expressed by the ratio of difference (=0.893 Å) in the lattice constant of both crystals to the lattice constant (=5.431 Å) of silicon single crystal is as large as about 16.6%. In order to prevent peeling of the boron phosphide layer from the Si substrate surface due to this large lattice mismatch degree, technical means of providing a low-temperature buffer layer on the Si substrate surface is disclosed, where the buffer layer comprises a polycrystalline boron phosphide containing an amorphous portion grown at a relatively low temperature (see, U.S. Pat. No. 6,069,021, supra).

In conventional techniques, the boron phosphide-base semiconductor layer is formed using, for example, a silicon single crystal having a surface of {100} or {111} crystal plane as the substrate (see, U.S. Pat. No. 6,069,021, supra). In particular, silicon atoms are densely present on the {111} crystal plane as compared with {100} crystal plane and this is considered effective for preventing boron (B) and phosphorus (P) constituting the low-temperature buffer layer from penetrating into the inside of the silicon single crystal substrate.

However, the distance between {111} crystal planes of the silicon single crystal is about 3.136 Å, whereas the distance of {110} crystal planes of boron phosphide (BP, lattice constant =4.538 Å) is 3.209 Å and does not agree with the distance between {111} crystal planes of the silicon single crystal. Therefore, the boron phosphide layer provided on a conventional silicon single crystal substrate having a surface of {111} crystal plane is disadvantageously a poor-quality crystal layer containing a large amount of crystal defects such as dislocation or stacking fault.

The present invention provides a technique for giving a boron phosphide-base semiconductor layer having excellent crystallinity by using a silicon single crystal substrate having a surface such that the distance between {111} crystal planes of silicon intersecting with the surface of {111} silicon single crystal agrees with the distance between {110} crystal planes of boron phosphide.

BRIEF SUMMARY OF THE INVENTION

The object of the present invention is to solve the above-described problems in conventional techniques by specifying the azimuth of the crystal plane constituting the surface of a silicon single crystal substrate. More specifically, the present invention provides the following embodiments:

(1) a compound semiconductor device comprising a silicon (Si) single crystal substrate having provided on the surface thereof a boron phosphide (BP)-base semiconductor layer containing boron (B) and phosphorus (P) as constituent elements, wherein the surface of the silicon single crystal substrate is a {111} crystal plane inclined at an angle of 5.0° to 9.0° toward the <110> crystal azimuth;

(2) the compound semiconductor device as describe in (1) above, wherein the surface of the silicon single crystal substrate is a {111} crystal plane inclined at an angle of 7.3±0.5° toward the <110> crystal azimuth;

(3) the compound semiconductor device as described in (1) above, which comprises a stacked layer structure such that a boron phosphide-base semiconductor layer having a {110} crystal plane is stacked on a silicon single crystal substrate having a surface of {111} crystal plane inclined at an angle of 5.0° to 9.0° toward the <110> crystal azimuth, through a low-temperature buffer layer composed of a boron phosphide-base semiconductor layer;

(4) the compound semiconductor device as described in (2) above, which comprises a stacked layer structure such that a boron phosphide (BP) semiconductor layer having a {110} crystal plane is stacked on a silicon single crystal substrate having a surface of {111} crystal plane inclined at an angle of 7.3±0.5° toward the <110> crystal azimuth, through a low-temperature buffer layer composed of a boron phosphide-base semiconductor layer;

(5) a light-emitting device comprising the compound semiconductor device described in any one of (1) to (4) above; and (6) a transistor comprising the compound semiconductor device described in any one of (1) to (4) above.

Furthermore, the present invention provides the following embodiments:

(7) a method for producing a compound semiconductor device, comprising stacking a boron phosphide-base semiconductor layer having a {110} crystal plane on a silicon single crystal substrate having a surface of {111} crystal plane inclined at an angle of 5.0° to 9.0° toward the <110> crystal azimuth, through a low-temperature buffer layer composed of a boron phosphide-base semiconductor layer; and (8) a method for producing a compound semiconductor device, comprising stacking a boron phosphide (BP) semiconductor layer having a {110} crystal plane on a silicon single crystal substrate having a surface of {111} crystal plane inclined at an angle of 7.3±0.5° toward the <110> crystal azimuth, through a low-temperature buffer layer composed of a boron phosphide-base semiconductor layer.

DETAILED DESCRIPTION OF THE INVENTION

Figure 1:
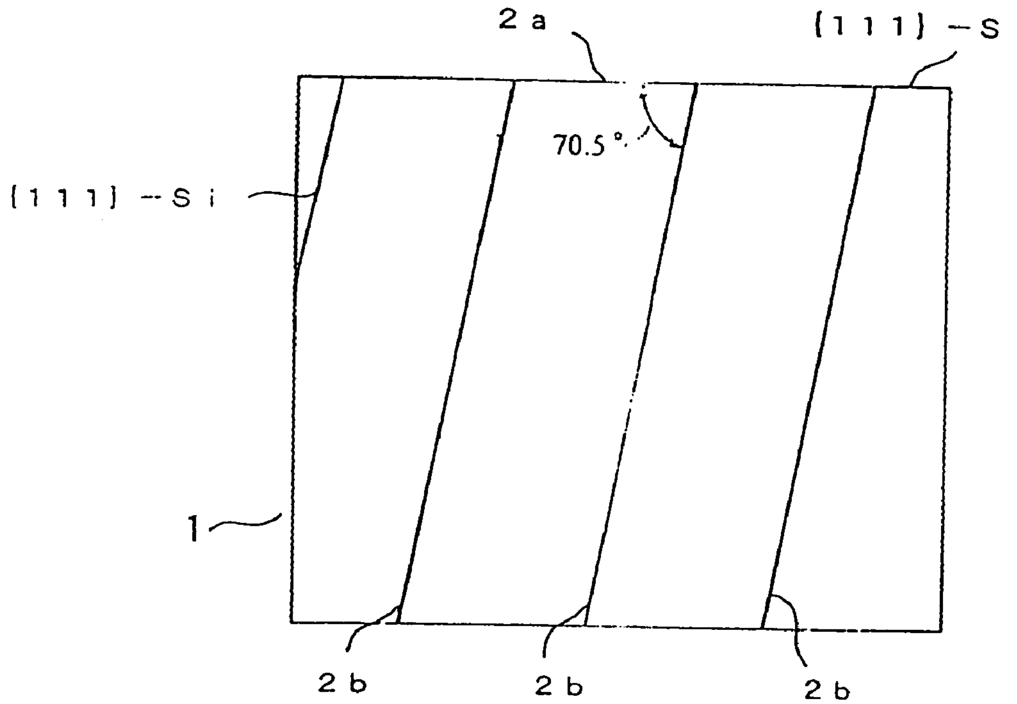
FIG. 1 is a cross-sectional schematic view of a {111}-silicon single crystal having a surface of {111} crystal plane.

The present invention is described below by referring to FIG. 1 which schematically shows the cross section of a {111}-silicon single crystal 1 having a surface of {111} crystal plane 2*a*. The surface of the {111}-silicon single crystal is an exact {111} crystal plane 2*a* not inclined toward any crystal azimuth. In a zinc-blende type cubic crystal, the intersection angle of {111} crystal planes is 70.5° (see, *Yasashii Denshi Kaisetsu to Shoto Kesshogaku* (*Fundamental Electron Diffraction and Elementary Crystallography*), 1st ed., 1st imp., page 57, Kyoritsu Shuppan (Jul. 10, 1997)). Therefore, in the {111}-silicon single crystal 1, a {111} crystal plane 2*b* intersecting at an angle of 70.5° is present in the {111} crystal plane 2*a* constituting the surface. The distance between {111} crystal planes of an Si single crystal is about 3.136 Å and the difference, for example, from the distance (=3.209 Å) of {110} crystal planes of boron phosphide (BP) is about 0.073 Å. In other words, the ratio (=0.073 Å/3.136 Å) of this difference (=0.073 Å) in the distance of crystal planes to the distance of {111} crystal planes of an Si single crystal reaches about 2.3%. That is, on the non-inclined silicon {111} crystal plane, the large difference between the distance of crystal planes and the distance, for example, of {110} crystal planes of boron phosphide still remains as it is.

Figure 2:
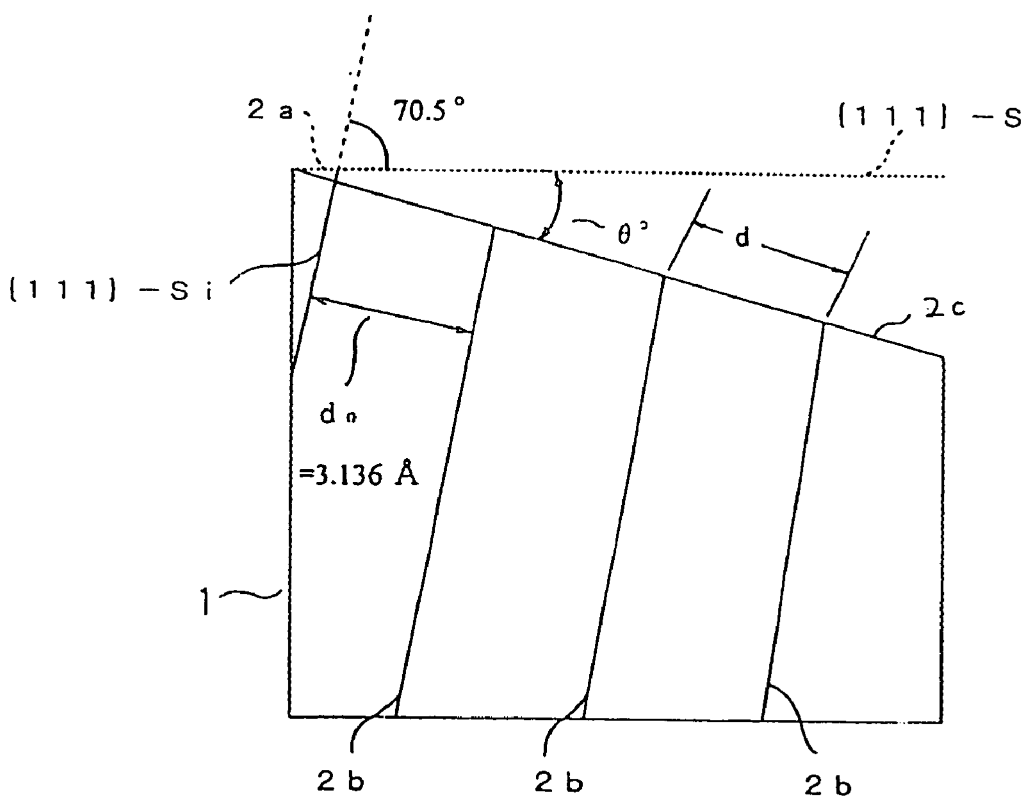
FIG. 2 is a cross-sectional schematic view of a {111}-silicon single crystal having a surface of {111}-crystal plane inclined at an angle of θ° toward the <110> direction.

On the other hand, FIG. 2 schematically shows the relationship between the distance (=d (unit: Å)) of crystal planes 2*b* intersecting with the {111} crystal surface 2*c* inclined at an angle of θ° (0°<θ<90°) toward the <110> crystal direction and the original crystal plane distance (=$d_0$ (Å)) of {111} crystal planes 2*b*. On the {111} crystal plane surface 2*c* inclined toward the <110> crystal direction, the distance (=d) between {111} crystal planes of Si is longer than $d_0$ (=3.136 Å). The distance (=d) between {111} crystal planes 2*b* intersecting with the {111} crystal surface 2*c* inclined at θ° toward the <110> crystal direction can be obtained by the following formula (1):

$$d(\text{Å})=d_0/\sin(\theta+70.5)° \quad \text{(formula (1))}$$

As the θ is larger, the d more approximates to $d_0$.

According to formula (1), when θ=5.0° (sin(5.0°+70.5°)=0.9681), the is 3.239 Å and agrees with the crystal plane distance of {110} crystal planes, for example, of a boron gallium phosphide mixed crystal ($B_{0.95}Ga_{0.05}P$). When θ=9.0° (sin(79.5°)=0.9832), the d is 3.190 Å and a {111} crystal plane 2*c* having {111} crystal planes 2*b* intersecting at intervals agreeing with the distance between {110} crystal planes, for example, of $BN_{0.03}P_{0.97}$ can be obtained. By setting the θ to from 5.0° to 9.0°, the ratio of difference in the distance of {110} crystal planes of a monomer boron phosphide (BP) can be reduced to less than ±1.0% and this is advantageous for obtaining a boron phosphide-base semiconductor layer reduced in crystal defect density and having excellent crystallinity.

A preferred example of the practical embodiment of the present invention is a compound semiconductor device comprising a stacked layer structure such that a magnesium (Mg)-doped p-type $B_{0.95}Ga_{0.05}P$ layer comprising a {110} crystal plane is provided on a boron (B)-doped p-type Si single crystal substrate having a surface of {111} crystal plane inclined at 5.0° toward the <110> crystal azimuth, through a low-temperature buffer layer composed of zinc (Zn)-doped boron gallium phosphide mixed crystal ($B_{0.95}Ga_{0.05}P$). In another example, a stacked layer structure, for example, for use in light-emitting devices is constructed by stacking a silicon (Si)-doped p-type boron phosphide layer on a phosphorus (P)-doped n-type Si single crystal substrate having a surface of (−111) crystal plane inclined at 9.0° toward the [−100] direction, through a low-temperature buffer layer composed of undoped boron phosphide.

Figure 3:
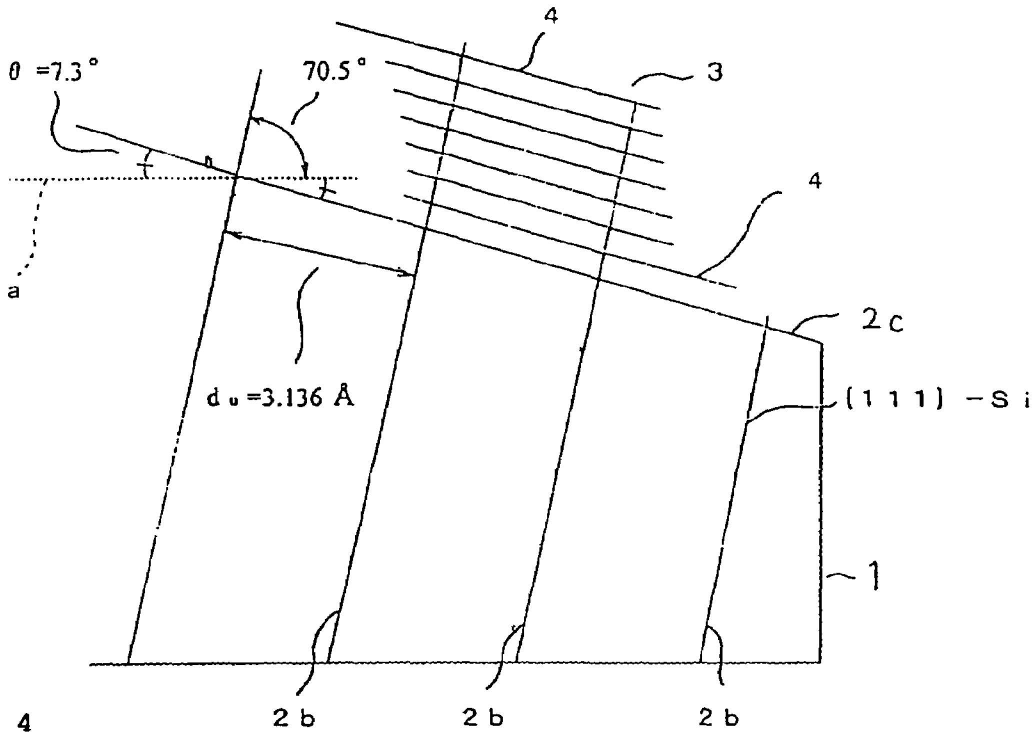
FIG. 3 is a cross-sectional schematic view for explaining the state of growth of a {110}-boron phosphide semiconductor layer on the {111}-Si surface inclined at an angle of 7.3° toward the <110> direction.

When θ is 7.3° (sin(77.8°)=0.9774), the d according to formula (1) agrees with the crystal plane distance (=3.209 Å) between {110} crystal planes of a monomer boron phosphide (BP). When θ is in the range of 7.3°±0.5°, the d falls in the range from 3.203 Å (when θ=7.8°) to 3.215 Å (when θ=6.8°) and therefore, the ratio of difference between the distance (=3.209 Å) of {110} crystal planes of BP and d can be made as low as 0.2% or less. FIG. 3 schematically shows the state when the {110} crystal plane 4 of boron phosphide (BP) grows on a {111} silicon single crystal 1 substrate having a surface 2*c* of {111} crystal plane with θ of 7.3°, parallel to the substrate 1 surface. With the {111} crystal surface 2*c* inclined at 7.3° toward the <110> crystal direction, {111} crystal planes 2*b* intersect at intervals of 3.209 Å. This distance between {111} crystal planes 2*b* on the surface 2*c* agrees with the distance between {110}-crystal planes 4 of the boron phosphide-base semiconductor layer 3 and therefore, the growth of {110}-BP crystal layer 3 is accelerated. In particular, a boron phosphide semiconductor layer reduced in density of crystal defect, such as dislocation or stacking fault, and having excellent crystallinity can be obtained by virtue of matching with the plane distance (=d) of {111} crystal planes 2b intersecting with the {111}-silicon single crystal 1 surface 2c. Even in the case where the boron phosphide semiconductor layer is stacked on the surface of a silicon single crystal substrate, for example, with the intervention of a low-temperature buffer layer composed of a boron phosphide-base semiconductor layer, the effect of providing a boron phosphide semiconductor layer composed of {110} is not lost. When a polycrystalline low-temperature buffer layer containing an amorphous portion is provided, this is rather advantageous in that the obtained {110}-boron phosphide semiconductor layer can have excellent adhesive property to the silicon single crystal substrate.

By using the {110}-boron phosphide-base semi-conductor layer having excellent crystallinity formed on a {111}-Si substrate having a surface of {111}-crystal plane inclined at an appropriate angle toward the <110> crystal direction, a compound semiconductor device having excellent properties can be advantageously obtained. A preferred example of the practical embodiment of the present invention is a compound semiconductor device fabricated from a stacked layer structure such that a beryllium (Be)-doped p-type BP layer comprising {110} crystal plane is provided on a boron (B)-doped p-type Si single crystal substrate having a surface of (1-11) crystal plane inclined at 7.0° toward the [10-1] crystal azimuth, through a low-temperature buffer layer composed of undoped boron phosphide (BP). In particular, the crystal layer having excellent crystallinity composed of a boron phosphide layer having a band gap of 3.0±0.2 eV at room temperature can be effectively used as a barrier layer (clad layer) for constituting a light-emitting part in a single or double hetero-junction structure, for example, of a light-emitting device.

In addition to the light-emitting device, compound semiconductor devices such as photodetecting device, pn-junction diode (rectifier) and hetero-bipolar transistor (HBT) can be fabricated by using the boron phosphide-base semiconductor layer having excellent crystallinity according to the present invention. For example, a photodetecting device of surface photodetection type can be fabricated from a stacked layer structure obtained by sequentially stacking the following functional layers (B) to (E) on an electrically conducting substrate (A):

(A) an antimony (Sb)-doped n-type {111}-Si single crystal substrate having a surface of (111) crystal plane inclined at 7.3° toward the [110] crystal direction, (B) a low-temperature buffer layer composed of a polycrystal containing an amorphous comprising an Si-doped n-type boron phosphide (BP), (C) an Si-doped n-type boron phosphide layer mainly comprising a {110}-crystal plane oriented in parallel to the surface of substrate (A), (D) a high-resistance GaN layer mainly composed of cubic gallium nitride (GaN, lattice constant=4.510 Å) reduced in the lattice mismatch with the monomer boron phosphide (BP, lattice constant=4.538 Å), and (E) a beryllium (Be)-doped p-type boron phosphide layer.

In this stacked layer structure, a gallium nitride (GaN) layer is stacked on the boron phosphide layer having excellent crystallinity formed on the appropriately inclined surface of a (111)-silicon crystal reduced in the lattice mismatch degree, so that a GaN layer having excellent crystallinity can be formed.

Furthermore, for example, a npn-junction HBT can be fabricated from a stacked layer structure utilizing the boron phosphide-base semiconductor layer having excellent crystallinity, obtained by providing the following functional layers (i) to (iv):

(i) an antimony (Sb)-doped n-type {111}-Si single crystal substrate having a surface of (−111) crystal plane inclined at 7.3° toward the [110] crystal direction, which serves also as a collector layer, (ii) a low-temperature buffer layer composed of a polycrystal containing an amorphous comprising zinc (Zn)-doped p-type boron phosphide (BP), (iii) a base layer composed of Be-doped p-type boron phosphide layer mainly comprising a {110}-crystal plane oriented in parallel to the surface of substrate (i), and (iv) an emitter layer composed of silicon (Si)-doped p-type boron phosphide (BP).

In this structure, the base layer is composed of boron phosphide having low ionicity and, as a p-type impurity, added with beryllium to give a high hole density, so that the base layer can be advantageously composed of a low-resistance p-type conductive layer.

In the silicon (Si) single crystal substrate having a surface of {111} crystal plane inclined toward the <110> crystal azimuth, depending on the angle inclined, the distance between {111} crystal planes intersecting with the {111} crystal surface of Si can be agreed with the distance between {110} crystal planes of the boron phosphide-base semiconductor layer, particularly, the monomer boron phosphide (BP), so that the growth of boron phosphide-base semiconductor layer comprising a {110} crystal plane can be accelerated.

EXAMPLES

Example 1

Figure 4:
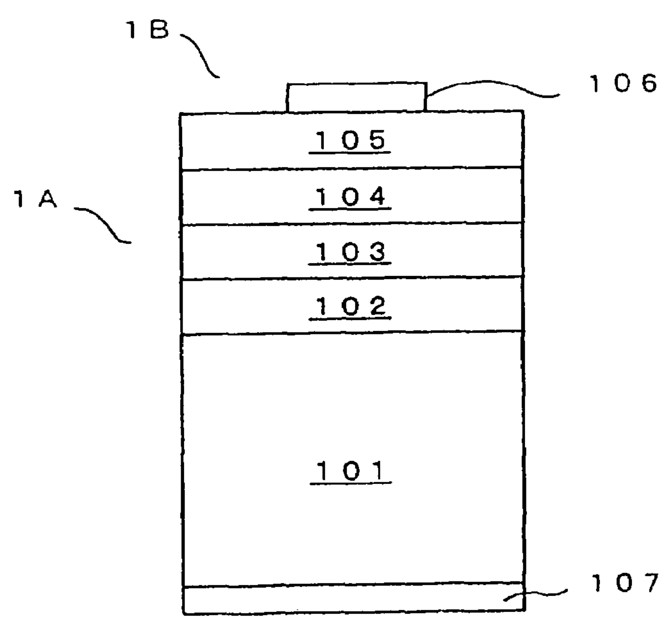
FIG. 4 is a cross-sectional schematic view of LED described in Example 1.

In Example 1, the present invention is specifically described by referring to the case of fabricating LED using as a substrate a silicon (Si) single crystal having a surface of (−1-11) crystal plane inclined at an angle of 5.0° toward the <−1-10> crystal direction. FIG. 4 schematically shows the cross-sectional structure of LED 1A according to Example 1.

The stacked layer structure 1B for fabricating the LED 1A was prepared by sequentially depositing the following functional layers (2) to (4) on a boron-doped p-type (−1.1.1)-silicon single crystal substrate 101. The surface of the substrate 101 was a (−111) crystal plane inclined at 5.0° toward the <−1-10> direction and therefore, the distance between {111} crystal planes ($d_0$=3.136 Å) intersecting with the surface was 3.272 Å.

A low-temperature buffer 102 composed of polycrystalline zinc (Zn)-doped boron phosphide (BP) with the major part being amorphous was grown at 350° C. by an atmospheric pressure MOCVD method of triethylborane $(C_2H_5)_3B$)/phosphine ($PH_3$)/hydrogen ($H_2$) system.

A lower barrier layer 103 composed of magnesium (Mg)-doped p-type boron indium phosphide mixed crystal ($B_{0.93}In_{0.07}P$, lattice constant=4.628 Å) layer was grown at 850° C. using an atmospheric pressure MOCVD means of $(C_2H_5)_3B$)/trimethyl indium ($(CH_3)_3In$)/$PH_3$/$H_2$ system. used was bis-cyclopentadienyl Mg (molecular formula: (bis-$(C_5H_5)_2Mg$).

A light-emitting layer 104 (carrier concentration: about $6\times10^{17}$ $cm^{-3}$, layer thickness: about 120 nm) mainly composed of cubic silicon (Si)-doped n-type $Ga_{0.75}In_{0.25}N$ layer (lattice constant=4.628 Å) was grown at 850° C. using an atmospheric pressure MOCVD means of trimethyl gallium $((CH_3)_3Ga)/(CH_3)_3In$/ammonia $(NH_3)/H_2$ system.

An upper barrier layer 105 with the major part being amorphous, composed of silicon-doped n-type boron phosphide (BP) having a room-temperature band gap of about 3.1 eV was grown at 400° C. using atmospheric pressure MOCVD means of $(C_2H_5)_3B/PH_3/H_2$ system.

The boron indium phosphide mixed crystal $(B_{0.93}In_{0.07}P)$ layer constituting the lower barrier layer 103 was provided through the low-temperature buffer layer 102 and therefore, was a continuous film free of release from the low-temperature buffer layer 102. Furthermore, the lower barrier layer 103 was obtained as a crystal layer composed of a {110} crystal plane of $B_{0.93}In_{0.07}P$. This crystal layer was formed using, as a substrate, a (−111) single crystal having Si-{111} crystal planes intersecting at intervals agreeing with the distance (d=3.272 Å) of the {110} crystal planes. Therefore, on observation of the crystal structure using cross-sectional TEM means, the density of dislocation or stacking fault was not increased inside the $B_{0.93}In_{0.07}P$ layer.

In the center of the upper barrier layer 105, an ohmic surface electrode 106 comprising a gold-tin (Au-Sn) circular electrode (diameter=120 μm) was provided. Also, almost throughout the back surface of the p-type Si substrate 101, an ohmic back surface electrode 107 comprising aluminum (Al) was provided. Thus, LED 1A was fabricated.

The fabricated blue LED 1A had the following properties (a) to (d):

(a) light emission center wavelength: 460 nm (b) luminance: 7 millicandela (mcd)

(c) forward voltage: 3.0 volt (V) (forward current=20 mA)

(d) reverse voltage: 5 V (reverse current=10 μA) The half-width (so-called full width at half maximum (FWHM)) of light emission spectrum was 20 nm and good monochromatic light emission was given. The lower barrier layer 103 composed of {110}-boron indium phosphide $(B_{0.93}In_{0.07}P)$ mixed crystal having a room-temperature band gap of about 3.1 eV and formed using, as a substrate, a {111}-Si single crystal inclined at 5.0° toward the <110> direction had excellent crystallinity and this contributed to the fabrication of a high brightness LED 1A.

Example 2

In Example 2, the present invention is specifically described by referring to the case of fabricating a Schottky junction-type field effect transistor (MESFET) using as a substrate a silicon (Si) single crystal having a surface of (1-11) crystal plane inclined at an angle of 7.3° toward the [1-10] crystal direction.

Figure 5:
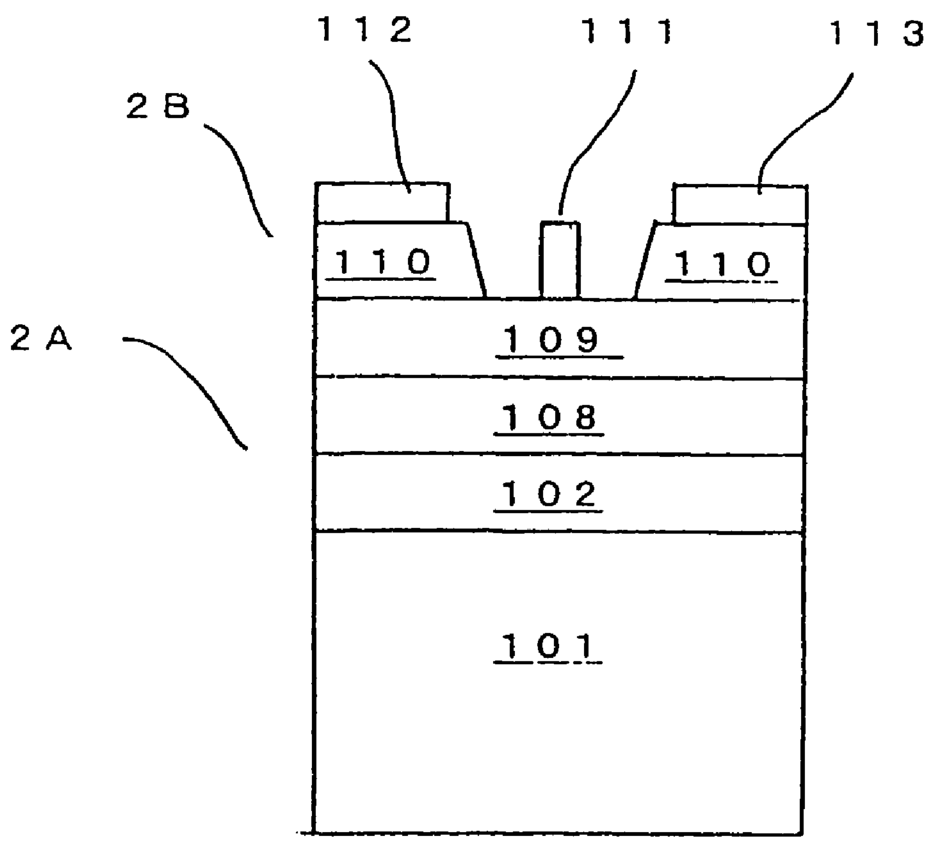
FIG. 5 is a cross-sectional schematic view of MESFET described in Example 2.

FIG. 5 schematically shows a cross-sectional structure of the MESFET 2A of Example 2. The stacked layer structure 2B for fabricating the MESFET 2A was prepared by sequentially depositing the following functional layers (1) to (4) on an undoped high-resistance (1-11)-silicon single crystal substrate 101. The surface of the substrate 101 was a (1-11) crystal plane inclined at 7.3° toward the [1-10] direction and therefore, the distance (=d) of {111} crystal planes ($d_0$=3.136 Å) intersecting with the surface was 3.209 Å.

A low-temperature buffer layer 102 composed of polycrystalline undoped high-resistance boron phosphide (BP) with the major part being amorphous was grown at 350° C. by an atmospheric pressure MOCVD method of $(C_2H_5)_3B/PH_3/H_2$ system.

A buffer layer 108 composed of an oxygen (O)-doped high-resistance (resistivity at room temperature: about $10^4$ Ω·cm) BP layer (lattice constant=4.538 Å) was grown at 850° C. by the same atmospheric pressure MOCVD means of $(C_2H_5)_3B/PH_3/H_2$ system. The oxygen doping source used was triethoxyborane (molecular formula: $(C_2H_5O)_3B$).

An operating layer 109 (carrier concentration: about $2\times10^{17}$ $cm^{-3}$, layer thickness: about 40 nm) mainly composed of a cubic undoped n-type $Ga_{0.94}$ $In_{0.06}N$ layer (lattice constant=4.538 Å) was grown at 850° C. by atmospheric pressure MOCVD means of $(CH_3)_3Ga/NH_3/H_2$ system.

An amorphous contact layer 110 for the formation of a Schottky gate electrode, composed of an undoped n-type BP layer having a room-temperature band gap of about 3.1 eV was grown at 400° C. by atmospheric pressure MOCVD means of $(C_2H_5)_3B/PH_3/H_2$ system.

The boron phosphide (BP) layer constituting the high-resistance buffer layer 108 was a crystal layer composed of a {110} crystal plane. The substrate 101 was a {111}-Si single crystal where the distance of {111} lattice planes of Si on the surface agreed with the distance (d=3.209 Å) of {110} the crystal planes of BP. Therefore, on observation of the crystal structure by cross-sectional TEM means, the measured dislocation density inside the high-resistance buffer layer 108 was less than about $1\times10^5$ $cm^{-2}$.

As shown in the cross-sectional schematic view of FIG. 5, the contact layer 110 in the region where a gate electrode 111 was to be formed was removed using a known photolithography technique. On the operating layer 109 exposed in that region, titanium (Ti) and aluminum (Al) was sequentially vacuum-deposited by electron beam vapor-deposition means in general to form a Schottky contact-type gate electrode having a two-layer structure where titanium (Ti) was on the side contacting the operating layer 109 and aluminum (Al) was the surface layer. The electrode length of the gate electrode 111 was about 2.5 μm. On the surface of the n-type BP contact layer 110 remaining on both sides of the operating layer facing each other with interposition of the gate electrode 111, an ohmic source electrode 112 and an ohmic drain electrode 113 were provided, respectively. The ohmic source electrode 112 and drain electrode 113 were not in contact with the operating layer 109 and each was constructed by a three-layer structure of gold-germanium alloy (95 wt % of Au+5 wt % of Ge), nickel (Ni) and gold (Au).

When a source-drain voltage ($=V_{DS}$) of +20 V was applied between the source electrode 112 and the drain electrode 113, the MESFET 2A exhibited the following direct current properties:

(a) source-drain current ($I_{DS}$): 2.5 mA (b) transconductance ($g_m$): 20 millisiemens (mS/mm)

(c) pinch-off voltage: −10.0 V

In particular, since the buffer layer 108 was composed of a {110}-BP layer having excellent crystallinity and high resistance formed using, as the substrate 101, a {111}-Si single crystal having a surface of {111} crystal plane inclined at 7.3° toward the <110> crystal azimuth, an effect of preventing $I_{DS}$ from leaking inside the buffer layer 108 was provided and an MESFET having excellent pinch-off property was obtained.

According to the present invention, a {111}-Si single crystal having a surface of {111} crystal plane inclined toward the <110> direction at an angle suitable for obtaining a boron phosphide (BP)-base semiconductor layer, particularly a {110}-boron phosphide-base semiconductor layer comprising a {110} crystal plane, is used as the substrate in fabricating a compound semiconductor device, so that, for example, a compound semiconductor light-emitting device ensuring excellent monochromaticity of emitted light can be provided by utilizing a boron phosphide-base semiconductor layer having excellent crystallinity.

Furthermore, according to the present invention, a {111}-Si single crystal where {111} crystal planes of Si intersect at the same interval as the distance between {110} crystal planes of, for example, boron phosphide (BP) is used as the substrate. By utilizing a boron phosphide layer having excellent crystallinity and high resistance, a field effect transistor is fabricated, so that an MESFET having excellent pinch-off property can be provided.

While the invention has been described in detail and with reference to specific embodiments thereof, it will be apparent to one skilled in the art that various changes and modifications can be made therein without departing from the spirit and scope thereof.

What is claimed is:

1. A method for producing a semiconductor device comprising stacking a low-temperature buffer layer composed of a boron phosphide-base semiconductor layer, and stacking a boron phosphide-base semiconductor layer having a {110} crystal plane on a silicon single crystal substrate having a {111} crystal plane surface inclined at an angle of 5.0° to 9.0° toward a <110> crystal azimuth.

2. A method for producing a semiconductor device comprising stacking a low-temperature buffer layer composed of a boron phosphide-base semiconductor layer, and stacking a boron phosphide semiconductor layer having a {110} crystal plane on a silicon single crystal substrate having a {111} crystal plane surface inclined at an angle of 7.3±0.50° toward a <110° crystal azimuth.

* * * * *